(12) United States Patent
Perras

(10) Patent No.: US 8,111,060 B2
(45) Date of Patent: Feb. 7, 2012

(54) PRECISION AC CURRENT MEASUREMENT SHUNTS

(75) Inventor: Andre C. Perras, McDonalds Corners (CA)

(73) Assignee: Guidline Instruments Limited, Smith Falls (CA)

( * ) Notice: Subject to any disclaimer, the term of this patent is extended or adjusted under 35 U.S.C. 154(b) by 455 days.

(21) Appl. No.: 12/433,931

(22) Filed: May 1, 2009

(65) Prior Publication Data

US 2009/0278527 A1 Nov. 12, 2009

Related U.S. Application Data

(60) Provisional application No. 61/050,737, filed on May 6, 2008.

(51) Int. Cl.
*G01R 1/20* (2006.01)
(52) U.S. Cl. .......................................... 324/126
(58) Field of Classification Search ................ None
See application file for complete search history.

(56) References Cited

U.S. PATENT DOCUMENTS

| | | | | |
|---|---|---|---|---|
| 4,001,684 A | * | 1/1977 | Fritts | 324/126 |
| 4,393,347 A | * | 7/1983 | Looper | 324/126 |
| 5,493,070 A | * | 2/1996 | Habu | 324/762.01 |
| 6,677,743 B1 | * | 1/2004 | Coolidge et al. | 324/126 |
| 7,098,647 B2 | * | 8/2006 | Tanaka et al. | 324/755.02 |
| 7,629,787 B2 | * | 12/2009 | Lu | 324/765.01 |
| 2005/0024806 A1 | * | 2/2005 | Hirasawa | 361/106 |
| 2011/0006754 A1 | * | 1/2011 | Biggadike | 324/126 |

FOREIGN PATENT DOCUMENTS

JP 2003315371 A * 11/2003

OTHER PUBLICATIONS

Translation of JP2003315371A, Hamano et al, Nov. 6, 2003.*

* cited by examiner

*Primary Examiner* — Jermele M Hollington
(74) *Attorney, Agent, or Firm* — Trevor C. Klotz

(57) ABSTRACT

A more precise and cost effective means than previously commercially available for measuring alternating currents up to 100 amperes in the frequency range from direct current to 100 kilohertz can be measured with precision approaching 0.001% employs a shield around a resistive network. The shield is electrically isolated from the resistive network, but acts as a heat sink to draw heat generated by the resistive network away, promoting fast stabilization times. The shield also provides electrical shielding from outside interference allowing the geometric arrangement of elements in the resistive network to minimize induced inductance and capacitance.

20 Claims, 2 Drawing Sheets

PRECISION AC CURRENT MEASUREMENT SHUNTS

CROSS REFERENCE TO RELATED APPLICATION

This application claims the benefit of priority of U.S. Provisional Patent Application No. 61/050,737 entitled "Precision AC Current Measuring Shunts" filed May 6, 2008, the contents of whi ch are expressly incorporated herein by reference.

FIELD OF THE INVENTION

This invention relates generally to the design of high precision alternating current measurement equipment for use with currents in a range from 1 µA to 100 A and in a frequency range from direct current to one megahertz.

BACKGROUND OF THE INVENTION

It is often necessary to determine the characteristics of an unknown alternating current. This can be done by measuring the magnitude of the current while independently determining its frequency. Measuring the magnitude of an unknown alternating current typically involves connecting the unknown alternating current through a known precision calibrated resistance device and measuring the voltage across the resistance element, or comparing a known direct current with that of the unknown alternating current by measuring the difference through a precision thermal current-to-voltage converter. Connecting the unknown alternating current through a precision resistance device is usually the preferred alternate technique as it is a less complicated procedure and because of the availability of precision alternating voltage meters.

In conventional measurement techniques, the measurement of the magnitude of an unknown alternating current is accomplished by connecting the unknown current through the calibrated resistance, commonly referred to as an alternating current shunt. A voltage reading across the resistance is taken and a simple Ohm's law calculation can be made to determine the current magnitude. If the frequency is not known, a frequency counter can also be connected across the resistance to determine the frequency of the alternating current. One skilled in the art will appreciate that though the discussion thus far has centered around voltage magnitude and frequency determinations, the phase relationship between the alternating current and the resulting voltage across the resistance cannot solely be determined using this technique. The voltage to current phase relationship depends on the impedance characteristics of the calibrated resistance device. These impedance characteristics will introduce increasingly significant errors in the measurements at higher frequencies. Both the effects of capacitance and inductance components, parasitic or otherwise, of the resistance device must be considered.

To provide high precision measurements of alternating current, the voltmeter must be suitably accurate and the voltage to current phase relationship of the calibrated resistance device must be known. Typically, voltmeters are most inaccurate when measuring low voltages, as typically the error in a voltmeter measurement is absolute and not relative. For low value resistances or low value currents, even a very sensitive voltmeter pushes towards an inaccurate region unless the resistance value and current to be measured are suitably matched. For higher value resistances the effect of even a small capacitive component of the voltmeter input terminals and cable connections will significantly reduce the accuracy of the voltmeter readings at the higher frequencies. On the other hand for low value resistances the inductive component of the connections will significantly increase the voltmeter readings at the higher frequencies, thus diminishing the accuracy of the result.

The process of selecting suitable resistance values for a particular shunt must take into account the power that will be dissipated during the measurement process. The measurement of currents of increasing magnitude requires greater power dissipation in the calibrated resistance device if the resulting voltage magnitude requirement is to be maintained. As either current or voltage increase linearly, the power dissipated by a fixed resistance increases as a square ($P=I^2R=V^2/R$). Typically a voltage above 200 millivolts is required to maintain measurement accuracy levels approaching 0.001%. For instance, an alternating current shunt in the range of 50 A to 100 A with a nominal resistance value of 0.004 ohms provides a voltage value in the range of 200 millivolts to 400 millivolts and would be required to dissipate 40 watts at the high end of this range. To provide sufficient thermal dissipation and prevent damaging the shunt, multiple resistive elements are typically used in the calibrated resistive device to provide sufficient surface area from which to dissipate the heat generated by passing the current through the resistive elements. In order to dissipate this thermal energy with a reasonable rise in temperature, a thermal path of sufficient area and thermal conductivity must be provided between the resistance elements and the surrounding environment.

Conventional designs increase the dissipative ability of the resistive device by making use of a number of resistive elements. The individual resistances are carefully arranged to reduce the adverse effects on the measurement.

One conventional design is a coaxial design making use of relatively long resistive wire elements. This design provides for a relatively flat frequency response but has poor temperature and power coefficients. The poor temperature and power coefficients are due primarily to limitations of the available resistance wire with temperature coefficients lower than 10 ppm/C. The overall result is poor thermal stability and very long stabilization periods (which can be on the order of a few hours) at currents above 1 ampere.

Another conventional design is a basic radial design utilizing metal film resistive elements with relatively high temperature coefficients similar to that of the coaxial design. In order to improve the thermal stability, the assembly utilizes an open enclosure design to reduce both the heat effects and the stabilization time. This results in an unshielded shunt which makes the element subject to a number of undesirable effects. A variation on this design makes use of a shielded enclosure with encapsulated resistive elements. The encapsulent interferes with the thermal dissipation of the generated heat and results in very long stabilization times at higher currents.

The final conventional design presented here is known in the art as a rectangular box design. This design is primarily designed to optimize the frequency response to 100 kHz and above. The size of the box required for currents above 10 amperes is considered excessive and the cost is very high due to the complicated method of fabrication. This design does not provide an electrically shielded enclosure and thus is susceptible to failure if it encounters metallic objects in the immediate vicinity. This design has been limited in its use and deployment due to the high cost, environmental, and safety limitations.

The phase relationship of the voltage to the current is dependant on the physical arrangement of the resistive components in the AC shunt. A number of techniques have been used to minimize the inductive and capacitive components that affect the impedance characteristics of the resistive device. The residual inductive and capacitive components result in a frequency dependency in the effective resistance of the device. The effect is such that measurement errors are introduced unless this dependency is known a priori and taken into account in the measurement process. For resistance values below approximately 10 ohms a residual inductive component that can be modeled as being in series with the current path predominates as the frequency dependent component of the nominal resistance. Above 10 ohms a residual capacitance component that can be modeled as being in parallel with the current path predominates as the frequency dependent component. An inductive component of 50 nanohenries will increase the shunt resistance the equivalent of 31 milliohms in series at 100 kilohertz and a capacitance component of 10 picofarads will decrease the resistance the equivalent of 160 kilo-ohms in parallel with the shunt at a frequency of 100 kilohertz.

The design of precision alternating current shunts must take into consideration the minimization of inductive and capacitive components as well as the minimization of the effects of power dissipation.

Therefore it is desirable to provide an alternating current shunt design that minimizes changes in the effective resistance value with increasing current as well as with increasing frequency over a specific measurement range.

SUMMARY OF THE INVENTION

It is an object of the present invention to obviate or mitigate problems in previous AC shunt designs. In one aspect of the present invention, a precision resistance device is designed to minimize changes in effective resistance value of an alternating current shunt with increasing current as well as with increasing frequency over specific measurement ranges.

In a first aspect of the present invention, there is provided a current measurement shunt for receiving an input current and for providing a known resistance to the received current to allow a measurement of a voltage across the shunt. The shunt comprises a current end circuit, a potential end circuit, a plurality of resistive connections and a shield. The current end circuit receives the input current. The plurality of resistive connections electrically connects the current end circuit to the potential end circuit. Each of the connections is arranged radially about an axis and the plurality has a known total resistance. The shield is electrically isolated from, but in thermal communication with, the plurality of resistive connections to conduct generated heat away from the resistive connections.

In an embodiment of the first aspect of the present invention, the current end circuit includes a current end connector for receiving the input current from an external source and the potential end circuit includes a potential end circuit connector for receiving a current from the potential end circuit and for providing that current to an external network.

In another embodiment of the first aspect of the present invention, each of the resistive connections in the plurality includes a wire lead and a resistive element. In other embodiments, the resistive element can be mounted atop the potential end circuit and is connected to the current end circuit by the wire lead. The resistive element can be a metal foil element, such as a high precision bulk metal foil element.

In a further embodiment of the present invention, each of resistive connections in the plurality is connected in parallel to the other resistive connections in the plurality. In another embodiment, each of the resistive connection in the plurality is arranged to reduce mutual inductance and capacitance effects in the other connections in the plurality. In another embodiment, each of the resistive connection in the plurality is arranged to increase heat dissipation.

In another embodiment of the first aspect of the present invention, each of the resistive connection in the plurality is located in close proximity to the shield to facilitate heat transfer from each of the resistive connections to the shield. Each of the resistive connection in the plurality can be thermally connected to the shield using a thermal transfer compound to facilitate communication of generated heat to the shield.

In yet another embodiment of the first aspect of the present invention, the shield can include a potential end shield plate, a outer ring shield and a current end shield plate, each of the shield plates abutting opposing ends of the outer ring shield. The shield plates and the outer ring shield can be metallic in embodiments of the present invention. The potential end shield plate can be electrically isolated from the potential end circuit by isolating spacers, and the current end shield plate can also be electrically isolated from the current end circuit by isolating spacers. The outer ring shield can be electrically connected to the current and potential end shield plates but electrically isolated from the potential end circuit, the current end circuit and the plurality of resistive connections.

In a further embodiment of the first aspect of the present invention, the shield electrically shields the end circuits and the resistive connections from external electrical fields.

Embodiments of the present invention provide for a more precise and cost effective device than those previously commercially available for measuring alternating currents. In one embodiment of the present invention, currents up to 100 amperes in a frequency range from direct current to 100 kilohertz can be measured with precision approaching 0.001%.

In aspects of the present invention numerous advantages can be realized. Utilization of ultra high precision bulk metal foil resistive elements with very low temperature and power coefficients can significantly reduce the temperature and thermal dissipation instabilities present in conventional implementations. Incorporation of a high number of parallel current paths in a radial geometric pattern can reduce overall inductance such that frequency dependence can be reduced to 0.01% or lower over the frequency range of DC to 100 kHz. Incorporation of a metallic circular shielded enclosure can allow for an extension of coaxial input and output connections such that effects of stray electrical fields associated with current measurements is diminished. Arranging the resistive elements in close proximity to the outer cylindrical shield can utilize the shield material as a heat sink to effectively dissipate generated heat so that temperature rise at higher currents is reduced. The incorporation of an outer cylindrical shield can also provide for safe operation at currents higher than 20 amperes.

Other aspects and features of the present invention will become apparent to those ordinarily skilled in the art upon review of the following description of specific embodiments of the invention in conjunction with the accompanying figure.

BRIEF DESCRIPTION OF THE DRAWINGS

Embodiments of the present invention will now be described, by way of example only, with reference to the attached Figures, wherein.

DETAILED DESCRIPTION

The present invention is directed to high precision alternating current measurement resistance shunts.

The discussion below should be taken to be exemplary in nature, and not as limiting of the scope of the present invention. The scope of the present invention is defined in the claims, and should not be considered as limited by the implementation details described below, which as one skilled in the art will appreciate, can be modified by replacing elements with equivalent functional elements.

Figure 1:
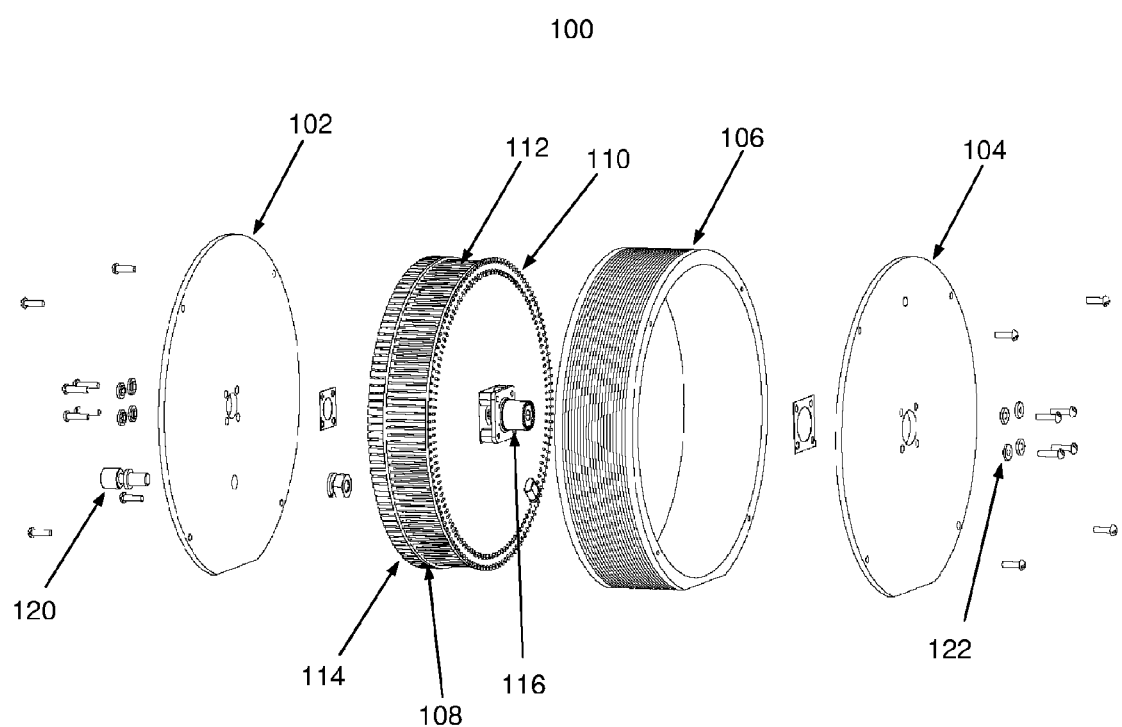
FIG. 1 illustrates an exploded current end view of an exemplary AC shunt embodying the present invention.
Figure 2:
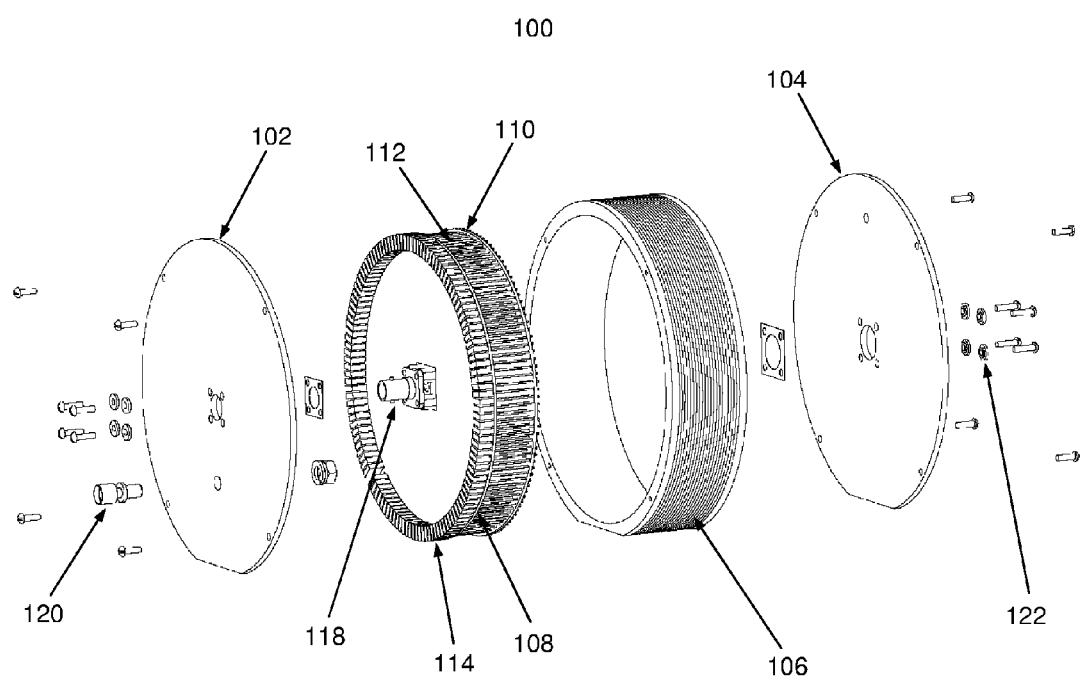
FIG. 2 illustrates an exploded potential end view of an exemplary AC shunt embodying the present invention.

A basic configuration of embodiments of the present invention is illustrated in FIGS. 1 and 2. Variations in dimensional characteristics between implemented embodiments allow for optimization of thermal dissipation requirements and reduction in mutual inductance and capacitance effects. Determining the specific dimensions for a particular implementation will be recognized by those skilled in the art as a matter of applying known techniques to optimize the implementation of the below described novel design. FIG. 1 illustrates an exploded view from the current input end and FIG. 2 illustrates the potential end of the AC shunt. More detailed description of the Figures will be presented below after a general description of the present invention.

A basic configuration of an AC shunt of the present invention includes a potential end shield plate, a potential end circuit board which includes a multiple of resistive elements connected in parallel and arranged radially to connect to a potential coaxial connector, a current end circuit board and isolated shield plate which connects to the individual resistive elements via wire leads arranged on the periphery of the circuit boards and also in parallel radially to the current end coaxial connector. One skilled in the art will appreciate that the wire leads themselves have a resistive value, and so can be logically combined with the resistive elements to be thought of as resistive connectors.

In some embodiments, the resistive elements are arranged in close proximity to the outer ring shield and the potential end shield plate such that the elements can be thermally connected with the use of a suitable thermal heat transfer compound. The individual resistive elements are preferably chosen to have a temperature coefficient on the order of 1 to 2 parts per million per degree centigrade or lower as may be commercially obtainable.

The number of resistive elements selected for use in a particular implementation of the present invention is a function of the current that the resistive device is designed to accommodate. The specific number of resistive elements that combine to make up a presently preferred implementation of the shunt design of the present invention can vary from approximately 20 resistive elements for the lowest current ranges and upwards to 250 or more resistive elements for the highest current ranges. The multiplicity of elements allows for a more effective thermal dissipation path and a reduction in the overall inductance of the shunt, as each resistive element is required to dissipate less heat individually than would be required with fewer resistive elements.

The end shield plates and outer ring shield are preferably electrically isolated from the coaxial connectors with suitable insulating spacers. Alternatively, the shield can be electrically connected to the shell of either the potential coaxial connector or the current coaxial connector by removing one or more of the associated insulating spacers. Another alternative is to connect the shield with the shield terminal provided to an external guard potential completely isolated electrically from the shunt circuits.

The spacing between the potential side circuit and the current side circuit can be extended to reduce mutual inductance effects at higher frequencies and higher current ranges as needed on an embodiment by embodiment basis. The minimal spacing used by one embodiment of one presently preferred embodiment is on the order of from 30 millimeters for lower current ranges to 200 millimeters or more for the highest current ranges. The greater the spacing the greater the thermal energy dissipation area provided and the lower the effective mutual inductance between the current input and the potential output of the shunt.

The above-described implementation of the present invention diminishes changes in the effective resistance value of an alternating current shunt as either the current amplitude or frequency changes over specific measurement ranges. Thus, embodiments of the present invention can provide for a more precise and cost effective means for measuring a variety of alternating currents than previously commercially available solutions.

Implementations of the above-described AC shunt provide a precise and cost-effective device for measuring alternating currents. In realization of the present invention, alternating currents in the range of 1 microampere to up to 100 amperes in the frequency range from direct current to 100 kilohertz can be measured with precision approaching 0.001% using suitable voltmeters as described above. The calibrated resistance device makes use of a number of technical features to achieve its improved response and heat dissipation. These features may include:

use of ultra precision bulk metal foil resistive elements with very low temperature and power coefficients to significantly reduce temperature and thermal dissipation instabilities;

incorporation of a high number of parallel current paths in a radial geometric pattern to minimize overall inductance such that frequency dependence is reduced to 0.01% or lower over the frequency range of DC to 100 kHz;

incorporation of a simple means of increasing the spacing between the current input and the potential output terminals and the associated current paths such that the mutual inductive effects of the proximity is significantly reduced;

incorporation of a metallic circular shielded enclosure that allows for an extension of the coaxial input and output connections such that the effects of stray electrical fields associated with current measurements is minimized;

positioning of resistive elements in close proximity to the outer cylindrical shield such that the shield material may be utilized as a heat sink for effective thermal dissipation and that temperature rise at higher currents is kept to a minimum (resistive elements can be thought of as being electrically isolated from the shield, but thermally connected to it).

FIG. 1 illustrates an exploded view of an embodiment of an AC shunt from the current end perspective. An AC shunt is required to provide a known resistive value to a current, so that a voltmeter reading can be obtained over the shunt to allow for measurement of the potential drop across the shunt. The voltage measurement, along with the known resistance value allows for the current to be determined. The AC component of the current can cause parasitic inductance and capacitance effects if the shunt is not properly shielded. Because the voltage measurement is preferably taken in a region of the voltmeter that allows for a minimal measurement error, and the current is unknown, the shunt must present a known transfer response to a large number of current amplitudes and frequencies.

Shunt 100 is shielded, the shield being formed by the collection of the potential end shield plate 102, the current end shield plate 104 and the outer ring shield 106. By forming a cylindrical shielding around the interior of the shunt, the shielding elements 102 104 and 106 prevent extraneous electrical fields from interfering with the operation of shunt 100 by inducing changes in the known characteristics. Furthermore, the shielding elements 102, 104 and 106 prevent electrical fields generated by shunt 100 from interfering with measurement equipment. Potential end circuit 108 and current end circuit 110 form the electrical endpoints of shunt 100. Wires 112 connect to resistive elements 114. The wires 112 and resistive elements 114 logically can be combined to form resistive connections. The wires 112 connect the potential end circuit 108 to the current end circuit 110, while the resistive elements 114 are mounted on potential end circuit 108. One skilled in the art will appreciate that ordering of the wires 112, resistive elements 114 and end circuits 108 and 110 can be modified, so long as current provided to shunt 100 is routed through the current end circuit 110, to the potential end circuit 108 through wires 112 and resistive elements 114. Current is introduced to the shunt 100 through the current end connector 116, which is shown in the illustrated embodiment as a coaxial connector. Those skilled in the art will appreciate that the current end connector 116 need not be a coaxial connector if other connector types are preferred for a particular embodiment. A shield post connector 120 is also optionally employed to assist in the task of electrically isolating the shielding elements 102 104 and 106 from the conductive elements 108, 110, 112 and 114.

By electrically isolating the shielding elements from the conductive elements, the conductive elements are effectively protected in a Faraday cage. This prevents many of the problems associated with external electrical fields. However, when an alternating current is introduced into the resistive connections (illustrated as being composed of the resistive elements 114 and the wire leads 112), electrical fields can be generated in each wire that can affect the characteristics of the other wires. To mitigate this problem, a radial arrangement of wires 112 and resistive elements 114 is employed. By maintaining an even radial arrangement about the axis of electrical transmission, the induced electrical effects of one wire are largely offset by the induced effects of another wire. The radial arrangement also allows for dissipation of heat through the shielding elements of the shunt 100. Although the outer ring shield 106 is electrically isolated from the conductive elements 108, 110, 112 and 114, these elements are preferably arranged to be in thermal communication with the outer ring shield 106. Thus, the shield elements 102, 104 and 106 are employed as a heat sink, allowing for the dissipation of the heat generated by the transmission of current through the shunt 100. The use of shielding as a heat sink allows for better cooling, and reduces the stabilization time issues encountered in the prior art. To further encourage thermal conductivity with the shield, the shield can employ a non-conductive connection to the electrically conductive elements. This non-conductive connection can use such elements as thermal transfer compounds known in the art. Furthermore, the interior of the outer ring shield 106 can be constructed from a non-conductive material, such as a ceramic, that will allow heat to be absorbed without forming an electrical connection to the circuits 108 and 110, or the wires 112 and the resistive elements 114.

FIG. 2 illustrates the AC shunt of FIG. 1 in an exploded view from the potential end perspective. Shunt 100 has the potential end plate 102, the current end plate 104 and the outer ring shield 106, which combine to form a shield around the internals of shunt 100. As indicated in FIG. 1, the shielding can be electrically isolated from the internals of shunt 100, while serving as a heat sink to draw generated heat to the exterior of shunt 100 allowing for better cooling. Shield post connector 120 allows for external access to potential end connector 118. The potential end connector 118 is illustrated as a coaxial connector, but much as with current end connector 116, the connector can take any form required, with coaxial connectors being used in a presently preferred embodiment. Resistive elements 114 are mounted on potential end circuit 108, and are connected to current end circuit 110 by wires 112.

One skilled in the art will appreciate that the spacers 122 illustrated in FIGS. 1 and 2 allow for the shield components to be isolated from the conductive components of the shunt 100. Though only one set of spacers 122 is numbered, those skilled in the art will appreciate that spacers can be employed on the current and potential ends of the shunt 100. Removal of either the current end spacers or the potential end spacers will bring the shield to the same potential as the end to which they are connected. When a shield post connector 120 is employed, the shield can be connected, through the post connector 120, to a ground ensuring that the level of the shield is held at the ground value. Those skilled in the art will appreciate that spacers and bolts are conventional mechanisms used to assemble numerous components. These particular isolating and fastening components are not required for practicing the present invention and other equivalent components known to those skilled in the art can be used without departing from the scope of the present invention.

Utilization of ultra high precision bulk metal foil resistive elements with very low temperature and power coefficients significantly reduces the temperature and thermal dissipation instabilities present in conventional implementations. Incorporation of a high number of parallel current paths in a radial geometric pattern minimizes overall inductance such that frequency dependence can be reduced to 0.01% or lower over the frequency range of DC to 100 kHz. Incorporation of a metallic circular shielded enclosure allows for an extension of coaxial input and output connections such that effects of stray electrical fields associated with current measurements is minimized.

The above-described embodiment of the present invention is intended to be an example only. Alterations, modifications and variations may be effected to the particular embodiment by those of skill in the art without departing from the scope of the invention, which is defined solely by the claims appended hereto.

What is claimed is:

1. A current measurement resistance for receiving an input current and providing a known resistance to the received current to allow measurement of a voltage across the resistance, the resistance comprising:
   a current end circuit for receiving the input current;
   a potential end circuit;
   a plurality of resistive connections for electrically connecting the current end circuit to the potential end circuit, each of the resistive connections in the plurality arranged radially about an axis, the plurality having a known total resistance, and each resistive connection in the plurality of resistive connections is connected in parallel to the other resistive connections in the plurality of resistive connections and arranged to at least one of reduce mutual inductance effects in the other resistive connections of the plurality of resistive connections, arranged to reduce mutual capacitance effects in the other resistive connections of the plurality of resistive connections, and arranged to increase heat dissipation; and a shield electrically isolated from, but in thermal communication with, the plurality of resistive connections to conduct generated heat away from the resistive connections.

2. The current measurement resistance of claim 1 wherein the current measurement resistance comprises at least one of the current end circuit including a current end connector for receiving the input current from an external source and the potential end circuit including a potential end connector for receiving a current from the plurality of resistive connections and for providing that current to an external circuit.

3. The current measurement resistance of claim 1 wherein each of the resistive connections in the plurality include at least a wire lead and a resistive element.

4. The current measurement resistance of claim 3 wherein each of the resistive connections in the plurality comprises at least one of the resistive element connected to the potential end circuit, the wire lead connected to the current end circuit, the resistive element being a metal foil element, and the resistive element being a precision bulk foil element.

5. The current measurement resistance of claim 1 wherein each of the resistive connection in the plurality is at least one of located in close proximity to the shield to facilitate heat transfer from each of the resistive connections to the shield, thermally connected to the shield using a thermal transfer compound to facilitate communication of generated heat to the shield, and thermally connected to the shield.

6. The current measurement resistance of claim 1 wherein at least one of the potential end shield plate, the outer ring shield, and the current end shield plate are metallic.

7. The current measurement resistance of claim 1 wherein the outer ring shield is electrically connected to the current end shield plate and the potential end shield plate but is electrically isolated from at least one of the potential end circuit, the current end circuit and the plurality of resistive connections.

8. The current measurement resistance of claim 1 wherein the shield electrically isolates the current end circuit, potential end circuit and the plurality of resistive connections from external magnetic fields.

9. A resistance for receiving an input current and providing a known resistance to the received current to allow measurement of a voltage across the resistance, the resistance comprising:

a current end circuit for receiving the input current;
a potential end circuit;
a plurality of resistive connections for electrically connecting the current end circuit to the potential end circuit, each of the resistive connections in the plurality arranged radially about an axis, the plurality having a known total resistance, and each resistive connection in the plurality of resistive connections is connected in parallel to the other resistive connections in the plurality of resistive connections and arranged to at least one of reduce mutual inductance effects in the other resistive connections of the plurality of resistive connections, arranged to reduce mutual capacitance effects in the other resistive connections of the plurality of resistive connections, and arranged to increase heat dissipation; and a shield electrically isolated from, but in thermal communication with, the plurality of resistive connections to conduct generated heat away from the resistive connections.

10. The resistance of claim 9 wherein the resistance comprises at least one of the current end circuit including a current end connector for receiving the input current from an external source and the potential end circuit including a potential end connector for receiving a current from the plurality of resistive connections and for providing that current to an external circuit.

11. The resistance of claim 9 wherein each of the resistive connections in the plurality include at least a wire lead and a resistive element.

12. The resistance of claim 9 wherein each of the resistive connections in the plurality comprises at least one of the resistive element connected to the potential end circuit, the wire lead connected to the current end circuit, the resistive element being a metal foil element, and the resistive element being a precision bulk foil element.

13. The resistance of claim 9 wherein each of the resistive connection in the plurality is at least one of located in close proximity to the shield to facilitate heat transfer from each of the resistive connections to the shield, thermally connected to the shield using a thermal transfer compound to facilitate communication of generated heat to the shield, and thermally connected to the shield.

14. The resistance of claim 9 wherein at least one of the potential end shield plate, the outer ring shield, and the current end shield plate are metallic.

15. The resistance of claim 9 wherein the outer ring shield is electrically connected to the current end shield plate and the potential end shield plate but is electrically isolated from at least one of the potential end circuit, the current end circuit and the plurality of resistive connections.

16. The resistance of claim 9 wherein the shield electrically isolates the current end circuit, potential end circuit and the plurality of resistive connections from external magnetic fields.

17. A current measurement resistance for receiving an input current and providing a known resistance to the received current to allow measurement of a voltage across the resistance, the resistance comprising:

a current end circuit for receiving the input current;
a potential end circuit;
a plurality of resistive connections for electrically connecting the current end circuit to the potential end circuit, each of the resistive connections in the plurality arranged radially about an axis, the plurality having a known total resistance; and
a shield electrically isolated from, but in thermal communication with, the plurality of resistive connections to conduct generated heat away from the resistive connection and comprising a potential end shield plate, an outer ring shield, and a current end shield plate, each of the shield slates abutting opposing ends of the outer ring shield and at least one of the potential end shield plate is electrically isolated from the potential end circuit by a first isolating spacer and the current end shield plate is electrically isolated from the current end circuit by a second isolating spacer.

18. A current measurement resistance for receiving an input current and providing a known resistance to the received current to allow measurement of a voltage across the resistance, the resistance comprising:

a current end circuit for receiving the input current;
a potential end circuit;

a plurality of resistive connections for electrically connecting the current end circuit to the potential end circuit, each of the resistive connections in the plurality arranged radially about an axis, the plurality having a known total resistance; and a shield electrically isolated from, but in thermal communication with, the plurality of resistive connections to conduct generated heat away from the resistive connections, wherein the received current is characterised by at least one of a frequency within the range 0 hertz (DC) to 1 megahertz (1 MHz) and a current within the range 1 microampere (1 µA) to 100 amperes (100 A).

19. A resistance for receiving an input current and providing a known resistance to the received current to allow measurement of a voltage across the resistance, the resistance comprising:

a current end circuit for receiving the input current;

a potential end circuit;

a plurality of resistive connections for electrically connecting the current end circuit to the potential end circuit, each of the resistive connections in the plurality arranged radially about an axis, the plurality having a known total resistance; and a shield electrically isolated from, but in thermal communication with, the plurality of resistive connections to conduct generated heat away from the resistive connection and comprising a potential end shield plate, an outer ring shield, and a current end shield plate each of the shield plates abutting opposing ends of the outer ring shield and at least one of the potential end shield plate is electrically isolated from the potential end circuit by a first isolating spacer and the current end shield plate is electrically isolated from the current end circuit by a second isolating spacer.

20. A resistance for receiving an input current and providing a known resistance to the received current to allow measurement of a voltage across the resistance, the resistance comprising:

a current end circuit for receiving the input current;

a potential end circuit;

a plurality of resistive connections for electrically connecting the current end circuit to the potential end circuit, each of the resistive connections in the plurality arranged radially about an axis, the plurality having a known total resistance; and a shield electrically isolated from, but in thermal communication with, the plurality of resistive connections to conduct generated heat away from the resistive connections, wherein the received current is characterised by at least one of a frequency within the range 0 hertz (DC) to 1 megahertz (1 MHz) and a current within the range 1 microampere (1 µA) to 100 amperes (100 A).

\* \* \* \* \*